United States Patent [19]
Skerlos

[11] 3,946,148
[45] Mar. 23, 1976

[54] TELEVISION RECEIVER OPERABLE IN EXACT OR EXTENDED RANGE TUNING MODES

[75] Inventor: Peter Constantine Skerlos, Arlington Heights, Ill.

[73] Assignee: Zenith Radio Corporation, Chicago, Ill.

[22] Filed: Oct. 3, 1974

[21] Appl. No.: 511,855

[52] U.S. Cl............................ 178/5.8 AF; 325/421
[51] Int. Cl.² ........................................... H04N 5/50
[58] Field of Search......... 178/5.8 R, 5.8 AF, 7.3 R; 331/47, 25, 16, 18; 325/421, 423, 416, 417, 433, 346; 334/11, 14, 15; 358/23

[56] References Cited
UNITED STATES PATENTS

| | | | |
|---|---|---|---|
| 3,454,710 | 7/1969 | Gassmann | 178/5.8 R |
| 3,750,029 | 7/1973 | Baars | 178/7.3 R X |
| 3,760,094 | 9/1973 | Skerlos | 358/23 |
| 3,787,612 | 1/1974 | De Vries et al. | 178/7.3 R X |

*Primary Examiner*—Robert L. Griffin
*Assistant Examiner*—Mitchell Saffian
*Attorney, Agent, or Firm*—Nicholas A. Camasto; Roy A. Ekstrand

[57] ABSTRACT

A color television receiver has a tuner converting the received signal to an intermediate frequency and fine tuning means for varying the converted frequency. An intermediate frequency filter couples the converted signal to a synchronous demodulator which includes a variable frequency reference oscillator in a closed loop control system which tracks the IF frequency thereby providing an extended range of tuning adjustment. A two pole switch is operable to couple the DC component of the closed loop control system error signal to the tuner and the AC component of the error signal to the reference oscillator thereby providing an "exact tuning" operation.

3 Claims, 3 Drawing Figures

TELEVISION RECEIVER OPERABLE IN EXACT OR EXTENDED RANGE TUNING MODES

RELATED PATENTS AND APPLICATIONS

This invention is related to U.S. Pat. No. 3,760,094 entitled AUTOMATIC FINE TUNING WITH PHASE-LOCKED LOOP AND SYNCHRONOUS DETECTION, abandoned application Ser. No. 494,448, filed Aug. 5, 1974, entitled COLOR TELEVISION RECEIVER WITH IMPROVED TUNING CHARACTERISTICS and Ser. No. 503,220, filed Sept. 5, 1974, entitled OSCILLATION SYSTEM FOR INTEGRATED CIRCUIT all of which are in the name of Peter C. Skerlos and assigned to Zenith Radio Corporation and all of which are hereby incorporated by reference.

BACKGROUND OF THE INVENTION

This invention relates to color television receivers and in particular to those which incorporate synchronous demodulators. The typical television receiver has a tuner which frequency converts the received information bearing signal by the familiar heterodyning process. A local oscillator is adjusted to produce an oscillatory signal a given frequency above that of a received television signal for converting the sound and video carriers in the received signal to corresponding intermediate frequency carriers which are supplied to frequency selective intermediate frequency amplifiers. The output of these amplifiers drives a detector which recovers the modulation from the carriers.

Due to its close frequency relationship to the suppressed chrominance subcarrier sidebands, the sound carrier in receivers not employing synchronous demodulation must be drastically attenuated in the video IF channel prior to detection of the video IF signal to preclude the production of the well known 920 kHz beat resulting from the presence in the detector of the chrominance and sound information. The effect of this interference on the displayed picture is highly objectionable and such color receivers generally include separate detectors for the luminance-chrominance information, and for the sound information.

The separate detection permits substantial trapping or attenuation of the sound information in the luminance-chrominance channel and minimization of the chrominance-sound beat. The sound trap is typically located in the frequency selective portion of the intermediate frequency amplifier at a point after the sound information has been coupled to the sound detector. The arrangement yields satisfactory reproduction of the televised picture provided the frequency conversion of the tuner is precise enough to insure accurate positioning of the sound carrier within the sound trap. However, significant limitation on the degree of mistuning which may be tolerated is imposed.

While "exact tuning" of a television receiver generally suffices, it is often desirable to adjust the tuner and alter the frequency of the intermediate frequency signal. For example, preferential adjustment of the picture characteristics may be obtained by changing the effect of the intermediate frequency amplifiers on the luminance components or on local extraneous interference signals; or relaxed tuning requirements may be obtained.

As is well known, mistuning of the tuner oscillator moves the intermediate frequency signals, and their corresponding modulation components, within the intermediate frequency filter response characteristic. In receivers employing conventional envelope-type detectors this results in severe chrominance-sound (920 kHz) beat in one direction and loss of color in the other direction.

With currently used highly selective non-linear sound traps phase distortions are produced in signals coupled through them. These phase distortions are, of course, of little significance for the sound information being trapped. However, for chrominance information, which must be accurately reproduced in both phase and amplitude, the effects of these phase distortions are highly objectionable in the displayed picture.

Synchronous demodulators achieve significant reduction in the amount of chrominance-sound beat and are distinguishable from the more conventional envelope demodulators in that they are gated or switched at the carrier frequency by a separate reference carrier. They require close frequency correlation between the demodulator switching signal and the IF carrier.

A television receiver with a synchronous demodulator, as described in the above mentioned U.S. Pat. No. 3,760,094, includes a fixed reference oscillator which produces a reference signal, free of harmonics and modulation components for switching the detectors. Such synchronous demodulators minimize the chrominance-sound beat to such an extent that sound trapping is not required and the television system of the patent does not include sound trapping in the IF amplifier. It does, however, include a frequency control system, operative on the receiver tuner, for maintaining the intermediate frequency signal at the same frequency as the reference oscillator. Therefore, no significant mistuning of the tuner oscillator, whether for preferential tuning reasons or for relaxed tuning requirements, is possible with the system of the above mentioned patent.

Another television receiver system with a synchronous demodulator, described in copending application (Skerlos II), includes a variable frequency reference oscillator to switch the detectors. The reference signal is maintained, by the action of a closed loop APC system, in frequency synchronization and at a predetermined phase with the IF carrier despite its frequency variations. The receiver includes an intermediate frequency amplifier having a response curve which is not distorted by the presence of sound carrier trapping and thus permits substantial deviations in the IF signal frequency without introducing objectionable color distortion or 920 kHz sound beat. The resulting advantage is two-fold. Firstly, the viewer may be provided with a control for preferentially adjusting the characteristic of the color picture reproduced on the receiver without introducing noticeable distortion therein, and secondly the receiver produces an acceptable color picture even though not "accurately tuned". The television receiver may be corrected to a conventional "exact tuning" receiver if desired by incorporating one of the many currently used AFC systems, which however, require additional components that must be properly aligned.

OBJECTS OF THE INVENTION

Accordingly, it is an object of the present invention to provide an improved color television receiver.

It is a more particular object of the present invention to provide an improved synchronous detector-type color television receiver operable in either an "exact tuning" mode or in an "extended tuning" mode which requires a minimum of additional components and adjustments.

DESCRIPTION OF THE DRAWINGS

The features of the present invention which are believed to be novel are set forth with particularlity in the appended claims. The invention, together with further objects and advantages thereof, may best be understood by reference to the following description taken in connnection with the accompanying drawing(s), in the several figures of which like reference numerals identify like elements, and in which:

SUMMARY OF THE INVENTION

A television receiver includes a voltage controllable tuner having a variable frequency local oscillator converting a received modulation bearing signal to an intermediate frequency signal and modulation recovery means including, variable frequency oscillation means producing a reference carrier, and a synchronous detector, responsive to the reference carrier and the intermediate frequency signal, recovering the modulation. The television receiver may be operated in either a first mode in which the frequency of the local oscillator is determined by the variable frequency oscillation means or in a second mode in which the frequency of the variable frequency oscillation means is determined by the local oscillator.

When operating in the first mode the television receiver has independent gain adjustable AC and DC control loops for the variable frequency oscillation means and the local oscillator, respectively which provide for enhanced pull in and system locking characteristics.

DETAILED DESCRIPTION OF THE INVENTION

Figure 1:
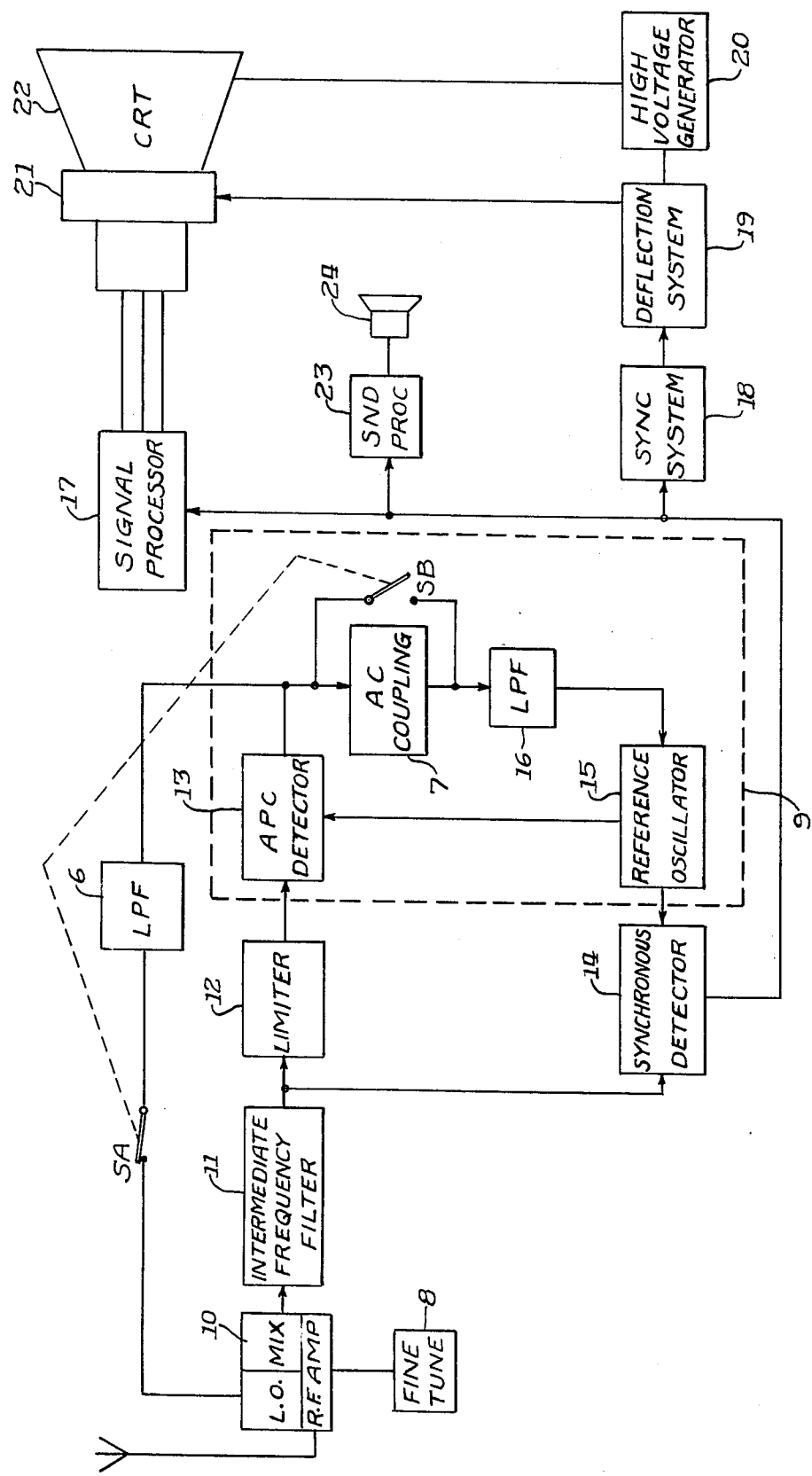
FIG. 1 is a block diagram representation of a color television receiver constructed in accordance with the present invention.

Referring now to FIG. 1, a tuner 10 includes a radio frequency amplifier (R.F. Amp.), a mixer (MIX) and a variable frequency local oscillator (L.O.) for receiving a television signal, converting it to an intermediate frequency signal and supplying the connected signal to an intermediate frequency filter 11. A fine tune block 8 indicates a viewer adjustable control coupled to tuner 10 for preferentially adjusting the frequency of the local oscillator. It will be appreciated that for one aspect of the invention, i.e., exact tuning, this block may be eliminated. The frequency selective circuitry in filter 11 couples the intermediate frequency signal to a synchronous detector 14 and to a limiter 12. A reference oscillator 15 generates a constant amplitude sinusoidal voltage which is coupled to synchronous detector 14. The output signal of limiter 12, comprising a portion of the intermediate frequency signal free of amplitude variations, and a sample of the output voltage of reference oscillator 15 are applied to an APC detector 13. APC detector 13 is coupled, via a low pass filter 16 and an AC coupling means 7 to reference oscillator 15. A switch SB bypasses AC coupling means 7. A low pass filter (LPF) 6 is coupled directly to detector 13 and via a switch SA to tuner 10. Switches SA and SB are shown separately but jointly operable, as indicated by the dashed line joining them and are of the "make before break" variety for best mode transition, but it should be understood that a single two pole switch mechanism may be used. The output of synchronous detector 14, comprising recovered modulation components of luminance, chrominance, deflection synchronizing signals and a sound signal is coupled to a signal processor 17, wherein the luminance and chrominance components are further processed and applied to the control electrodes of a CRT 22. A sound processor 23 recovers the sound information and amplifies it to a level sufficient to drive a speaker 24. A sync system 18 recovers the deflection synchronizing signals for controlling a conventional deflection system 19. Deflection system 19 supplies vertical and horizontal rate deflection voltages to a yoke 21 for scanning a CRT 22. A high voltage generator 20 responds to the horizontal rate portion of the output of deflection system 19 to produce the required accelerating voltages for CRT 22.

The intermediate frequency signal at the output of filter 11 comprises a "composite signal" having a video carrier amplitude modulated with components of luminance, chrominance and deflection synchronization and a frequency modulated sound carrier. As is well known, this composite signal has a maximum modulation level of 87.5 percent leaving a 12.5 percent portion of the video carrier which is free of amplitude variations. Limiter 12 contains circuitry which recovers this unmodulated portion of the video carrier by limiting its output signal excursions to less than the variations due to modulation components. The well-known limiter circuits fulfilling this function typically include an amplifier having such gain and output capability that the input signal derived from intermediate frequency filter 11 causes limiting or clipping of the output signal excursions. Also included within limiter 12 is a phase shifting network causing the output signal to be 90° output of phase with the output signal of intermediate frequency filter 11 to compensate for a 90° offset inherent in APC detector 13 which will be explained below in detail.

For proper operation of a synchronous detector the switching signal has the same frequency and phase as the amplitude modulated carrier. In the present invention receiver reference oscillator 15 is synchronized to the intermediate frequency signal by virtue of the closed loop control system fed by limiter 12, or alternatively, the frequency of the local oscillator tuner 10 is synchronized to the output of reference oscillator 15. These two synchronization methods define the alternate modes of operation for the receiver of the present invention.

The first mode, defined by the intermediate frequency signal controlling the frequency of reference oscillator 15, results when switch SA is open and SB is closed. Under these conditions AC coupling 7 is shorted and the closed loop system (indicated by dashed line 9) formed by APC detector 13, low pass filter 16 and reference oscillator 15 maintains the output of reference oscillator 15 in frequency synchronization and at a fixed place with the output signal of limiter 12.

The frequency and phase synchronization results from the well-known process of product detection, performed by detector 13, in which signals of different frequencies generate a "beat signal" output. The beat signal varies in amplitude at a rate determined by the frequency difference between the two input signals and is non-symmetrical. It therefore contains AC and DC components both of which are applied to oscillator 15. The DC components cause the oscillator to change frequency to reduce the frequency difference between input signals until synchronization or "lock" results. Because the beat signal is applied exclusively to oscillator 15 during first mode operation, the phase and frequency of oscillator 15 will "track" or follow that of the intermediate frequency signal. When the frequency of the intermediate frequency signal is varied (e.g., by fine tuning the receiver or as a result of tuning system errors), the required synchronization of the switching signal is maintained.

It is a characteristic of such closed loop automatic phase control systems that synchronization or lock is achieved when the compared signals are of the same frequency and in phase quadrature. Closed loop system 9, therefore, locks or synchronizes reference oscillator 15 at a phase 90° from that required to correctly switch synchronous detector 14. Phase shifting the limiter signal by 90° cancels the inherent offset of closed loop system 9.

The second mode of operation of the present invention is defined when switch SA is closed and SB is open. AC coupling 7 applies only the AC components of the beat signal produced by detector 13 to reference oscillator 15 and only the DC components pass through LPF 6 for application to the local oscillator of tuner 10. The exclusion of the DC component from reference oscillator 15 allows it to vary about its natural oscillation frequency of 45.75 MHz (corresponding to the video IF carrier) as a function of the AC beat signal, which effectively frequency modulates the oscillator output.

In a manner similar to that described above, APC detector 13 produces the non-symmetrical beat signal having both AC and DC components in response to limiter 12 and reference oscillator 15. The DC component, being a function of the average frequency difference, alters the frequency of the local oscillator in tuner 10 until the intermediate frequency signal corresponds to the natural frequency of reference oscillator 15. As a result, the receiver intermediate frequency is locked to 45.75 MHz and exact tuning results.

It should be noted that splitting the AC and DC components for application to separate oscillators yields attractive operational and design advantages over conventional automatic frequency control systems.

It is well known that the oscillator pull-in range, that is, the frequency difference which can be overcome, in a conventional automatic frequency control system is determined in part by the system's AC loop gain while hold-in or lock characteristics are determined substantially by DC loop gain. Since both the AC and DC components are active upon a common oscillator, both loop gains cannot be simultaneously optimized. As a result, conventional designs are generally a compromise between the desired AC and DC loop gains. Another significant limitation in pull-in range arises in conventional automatic frequency control systems because the AC loop is operative on the tuner and therefore includes the IF amplifiers which, due to their delay characteristics, severely limit pull-in range.

In contrast, the separate AC and DC control loops in accordance with the present invention permit optimization of both loop gains. Further, because the AC control loop does not include the IF amplifier, the delay characteristics inherent in the intermediate frequency amplifier are immaterial. This is of particular importance where acoustic surface wave devices, which have even greater delay characteristics than the more conventional filters, are used as intermediate frequency filters.

Figure 2:
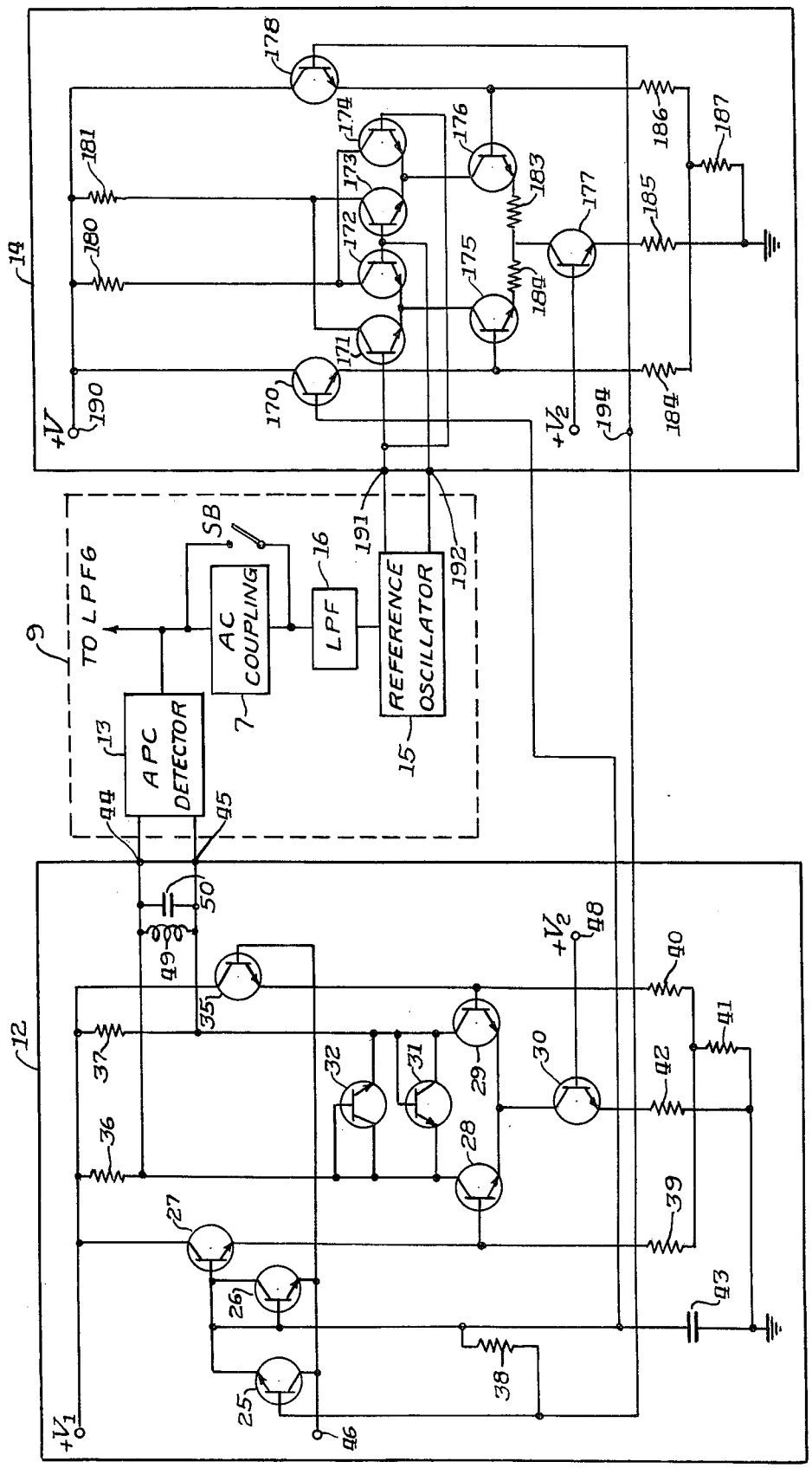
FIG. 2 is a partial block diagram, partial schematic diagram of a portion of the color television receiver of FIG. 1.

FIG. 2 shows a detailed circuit schematic of limiter 12 and synchronous detector 14. Closed loop control system 9 is shown in FIG. 2 in block diagram form (it is shown in detail in FIG. 3) to simplify the explanations of the limiter and synchronous detector. Limiter 12, closed loop control system 9 and synchronous detector 14 are preferably fabricated on a single monolithic integrated circuit, but should be obvious that similar discrete component apparatus can be constructed.

Limiter 12 comprises a differential amplifier formed by a pair of differentially connected transistors 28 and 29 having a common emitter connection coupled to ground by a transistor 30 and its emitter resistor 42. The base of transistor 30 is maintained at a fixed potential $V_2$ causing it to function as a constant current source. The intermediate frequency signal from intermediate frequency filter 11 is applied via a terminal 46 and an emitter follower transistor 35 to the base of transistor 29. Because the base of transistor 28 is held at a fixed potential by the combined actions of transistors 25, 26 and 27 and resistor 39 and capacitor 43, signal variations at the base of transistor 29 cause differential conduction variations in transistors 28 and 29. The differential current hus developed flows through load resistors 36 and 37 producing a differential output signal.

A pair of transistors 31 and 32 having their respective base collector junctions shorted form a pair of cross coupled diodes between the collectors of differential transistors 28 and 29 which conduct on alternate polarity signal excursions to limit the amplitude of signal developed. As a result, while the full extent of amplitude variations present in the intermediate frequency signal are coupled to differential transistors 28 and 29 the output signals produced are limited or clipped. A broadly tuned parallel resonant circuit, formed by an inductor 49 and a capacitor 50, is coupled between the collectors of transistors 28 and 29 for filtering the output signal. Thus a portion of the intermediate frequency signal substantially free of amplitude variations is coupled to terminals 44 and 45 of closed loop control system 9.

By actions to be described below in conjunction with FIG. 3, closed loop control system 9 produces a reference oscillator output identical in phase and frequency to the applied limiter signal. The reference oscillator output is coupled to terminals 191 and 192 of synchronous detector 14. Transistors 171–177 together with resistors 182–187, all within synchronous detector 14, form a doubly balanced multiplier circuit in which the respective differential currents through load resistors 180 and 181 develop the output voltage of the detector. The reference oscillator signal is applied with one phase to the bases of transistors 171 and 174 and with an alternate phase to the bases of transistors 172 and 173.

Transistors 171 and 174 operate together during one interval of the reference signal and transistors 172 and 173 during the alternate interval. Because the collectors of the transistor pairs thus formed are cross coupled, both load resistors (180 and 181) are alternately coupled to the collectors of the differential transistors 175 and 176, the emitters of which are coupled to ground by transistor 177. The base of transistor 177 is maintained at a fixed potential, $V_2$, causing it to function as a constant current source. During the first portion of the oscillator signal, transistors 171 and 174 are in conduction and couple load resistors 180 and 181 to the collectors of transistors 176 and 175, respectively. The intermediate frequency signal applied to the base of transistor 176, while transistor 175 remains at a fixed potential, causes a differential current flow developing voltages across resistors 180 and 181. During the alternate portion of the oscillator signal, transistors 172 and 173 are driven conductive, coupling load resistors 180 and 181 to transistors 175 and 176, respectively (in effect switching the connections). Again, the intermediate frequency signal applied to the base of transistor 176 causes a differential current to flow developing voltages across resistors 180 and 181. As discussed below the output signal of the reference oscillator is maintained at a constant amplitude, causing the voltages developed across resistors 180 and 181 to be solely a function of the amplitude variations of the intermediate frequency signal.

It should be noted that current flows only during selected intervals within each period of the video carrier, therefore, only those signal components which are in phase with the applied reference oscillator signal cause current variations through load resistors 180 and 181. As a result, the differential voltage developed comprises recovered modulation components of luminance, chrominance and sound together with deflection synchronizing signals, essentially free of chrominance-sound beat.

Figure 3:
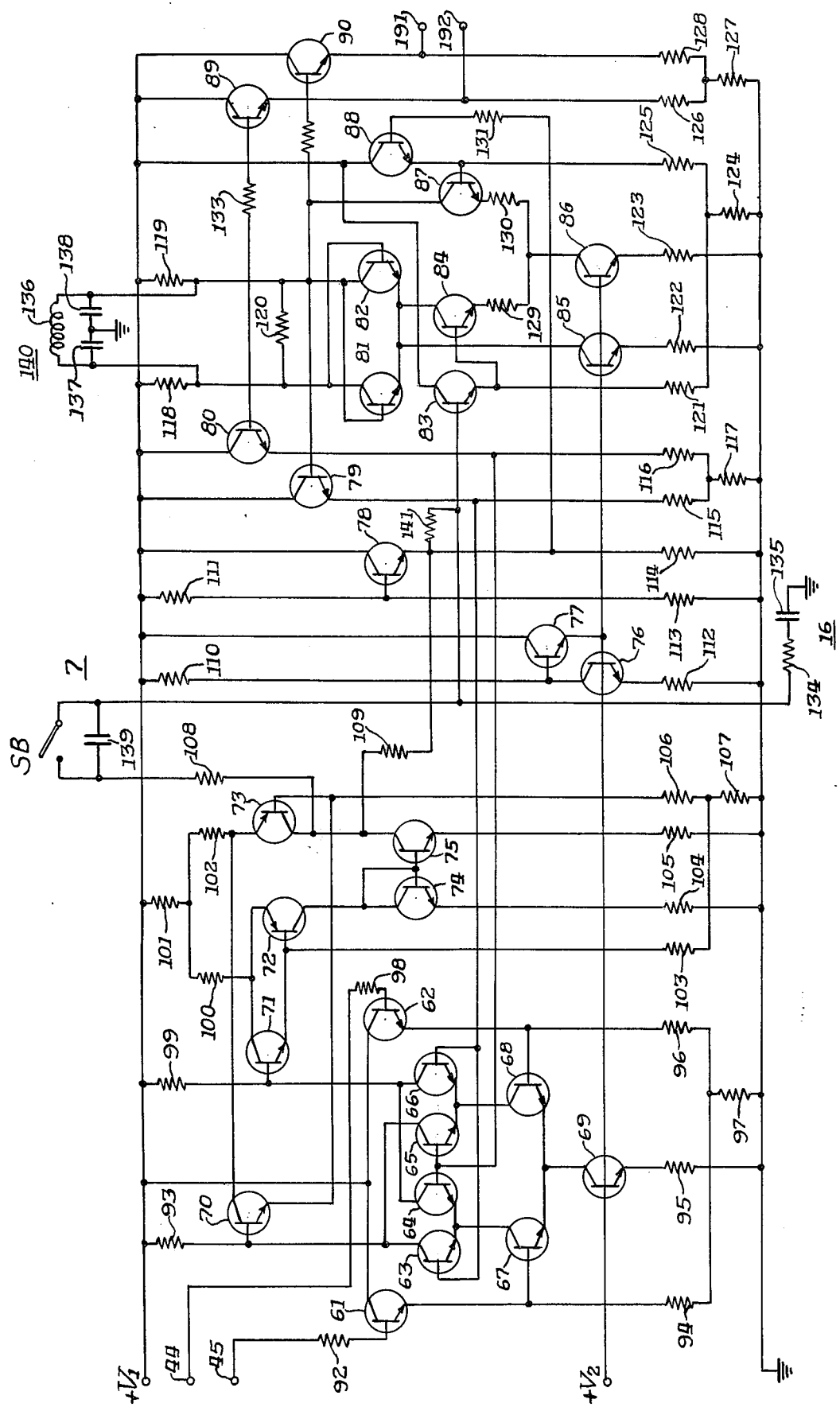
FIG. 3 is a schematic diagram of another portion of the color television receiver of FIG. 1.

In FIG. 3, closed loop control system 9 is shown in detail. APC detector 13 comprises a doubly balanced multiplier circuit similar that that described for synchronous detector 14 in which transistors 63–69 form the dual differential amplifier configuration and the respective differential currents in load resistors 93 and 99 are controlled by cross coupled transistors 63 and 65 and transistors 64 and 66. The output of reference oscillator 15, coupled by emitter followers 79 and 80 with one phase to the bases of transistors 66 and 63 with an alternate phase to the bases of transistors 64 and 65, respectively, switches load resistors 93 and 99 between the collectors of transistors 67 and 68. In contrast to the above-described synchronous detector, the limiter output signal at terminals 44 and 45 is coupled to the bases of both differential transistors (67 and 68) by emitter followers 61 and 62, respectively. Resistors 92 and 98, together with the input capacities of transistors 61 and 62, phase shift the limiter signal and in combination with the effect of the limiter tank circuit (inductor 49 and capacitor 40 in FIG. 4) provide a 90° phase shift to insure proper keying of synchronous detector 14.

Because the differential current flow in resistors 93 and 99 is a function of the relative phase and frequency relationship between the limiter and reference oscillator signals, it is a balanced control voltage suitable for synchronizing the reference oscillator. A transistor 70 couples one portion of the control signal through a transistor 73 and a resistor 108, causing one phase inversion, to the parallel combination of a capacitor 139 and switch SB. The alternate portion of the control signal is coupled through transistors 71, 72 and 75 and resistor 108 to capacitor 139 and switch SB, causing two phase inversions. The signal portions thus coupled are in phase or additive and are combined and coupled to a low pass filter 16 formed by the series combination of a resistor 134 and a capacitor 135, which is coupled to the base of transistor 83.

Reference oscillator 15 and its associated frequency control circuitry described below are the subject of the above mentioned copending application Ser. No. 503,220.

Three transistors 81, 82 and 85 comprise a differential amplifier configuration in which the collector of transistor 82 is coupled to the base of transistor 81 and the collector of transistor 81 is coupled to the base of transistor 82 to form a cross coupled differential oscillator circuit. The collectors of transistors 81 and 82 are each coupled to a source of positive voltage by resistors 118 and 119, respectively. A tank circuit 140 formed by an inductor 136 and the series connected capacitors 137 and 138, is coupled between the respective collectors of transistors 81 and 82. The junction of capacitors 137 and 138 is coupled to ground. Transistor 85 coupled the emitters of transistors 81 and 82 to ground through a resistor 122. The base of transistor 85 is connected to source of constant potential $+V_2$ causing a constant current to flow in transistor 85.

Transistors 84, 87 and 86 form a differential control amplifier in which current is alternatively conducted around or through the oscillator. The control signal at the junction of low pass filter 16 and the base of transistor 83 is applied to the base of transistor 84. In the absence of control signal the conduction of transistor 83 is determined by resistor 141 coupling its base to the emitter of transistor 78. Since the base of transistor 87 is maintained at a fixed potential, transistor 84 differentially determines the relative conductions between transistors 82 and 84 and hence the amount of current flow through oscillator transistors 81 and 82, thus controlling the oscillator frequency. The differential oscillator output signal developed between the collectors of transistors 81 and 82 is filtered by the action of tank circuit 140 to remove any harmonic components. Emitter followers 89 and 90 are buffer stages which couple the derived oscillator signal to terminals 191 and 192 of synchronous detector 14 to provide the keying signal.

What has been shown is a novel television receiver, operable in an exact tuning mode or an extended range variable frequency mode which provides the benefits of synchronous demodulation. The receiver also provides for optimization of automatic frequency control pull-in and holding characteristics.

While particular embodiments of the invention have been shown and described it will be obvious to those skilled in the art that changes and modifications may be made without departing from the invention in its broader aspects, and, therefore, the aim in the appended claims is to cover all such changes and modifications as fall within the true spirit and scope of the invention.

I claim:
1. A television receiver comprising:
 a voltage controllable tuner, including a variable frequency local oscillator, converting a received modulation bearing signal to an intermediate frequency signal;
 modulation recovery means including variable frequency oscillation means producing a reference carrier, a synchronous detector, responsive to said reference carrier and said intermediate frequency signal, recovering said modulation, and discriminating means, operative upon said variable frequency oscillation means, comparing said reference carrier to said intermediate frequency signal and generating a feedback control signal having AC and DC components;

said television receiver operable in a first mode in which the frequency of said local oscillator is determined by said variable frequency oscillation means or in a second mode in which the frequency of said variable frequency oscillation means is determined by said local oscillator; and mode selection means, permitting operation of said television receiver in either said first or said second mode, including means, operable in said first mode, separating said AC and DC components of said feedback control signal and supplying said DC components to said local oscillator and said AC components to said variable frequency oscillation means, and means, operable in said second mode, supplying said DC and AC components exclusively to said variable frequency oscillation means.

2. A television receiver as set forth in claim 1, wherein said means operable in said first mode include:
a low pass filter having a maximum transmission characteristic for DC signals, coupled to said local oscillator and said closed loop control means; and
AC coupling means, having a substantially zero transmission characteristic for DC signals, interposed between said variable frequency oscillation means and said discriminating means.

3. A television receiver as set forth in claim 2, wherein said mode selection means includes:
a switch making a first conductive connection in said first mode and opening said first connection to said second mode, and a second conductive connection in said second mode and opening said second connection in said first mode, said first conductive connection coupled serially within the signal path including said low pass filter and said second conductive connection coupled substantially in parallel with said AC coupling means.

* * * * *